United States Patent [19]

Manos

[11] Patent Number: 5,096,998
[45] Date of Patent: Mar. 17, 1992

[54] REACTIVE-OLIGOIMIDE ADHESIVES, LAMINATES, AND METHODS OF MAKING THE LAMINATES

[75] Inventor: Philip Manos, Wilmington, Del.

[73] Assignee: E. I. Du Pont de Nemours and Company, Wilmington, Del.

[21] Appl. No.: 607,755

[22] Filed: Oct. 31, 1990

[51] Int. Cl.⁵ .................. C08G 63/00; C08G 8/02; C08G 73/10; C08G 69/26

[52] U.S. Cl. .................................. 528/179; 528/125; 528/126; 528/128; 528/170; 528/176; 528/184; 528/188; 528/189; 528/322; 528/351; 528/353

[58] Field of Search .............. 528/353, 170, 322, 125, 528/126, 128, 176, 179, 184, 188, 189, 351, 353

[56] References Cited

U.S. PATENT DOCUMENTS

| | | | |
|---|---|---|---|
| 3,728,150 | 4/1973 | Yuan | 117/138.8 |
| 3,822,175 | 7/1974 | Yuan | 161/93 |
| 3,890,272 | 6/1975 | D'Alelio | 528/170 |
| 3,900,662 | 8/1975 | Yuan | 428/252 |
| 4,275,185 | 6/1981 | Lu | 528/170 |
| 4,418,181 | 11/1983 | Monacelli | 528/184 |
| 4,528,373 | 7/1985 | D'Alelio et al. | 546/66 |
| 4,711,964 | 12/1987 | Tan et al. | 548/461 |
| 4,801,682 | 1/1989 | Scola | 528/353 |
| 4,851,495 | 7/1989 | Sheppard et al. | 528/170 |

FOREIGN PATENT DOCUMENTS 8211526 1/1963 United Kingdom .

Primary Examiner—John Kight, III
Assistant Examiner—P. Hampton-Hightower

[57] ABSTRACT

A reactive oligoimide, which may serve as an adhesive for bonding at least one layer or film to another layer, preferably a flexible metallic layer to a flexible layer of a polyimide, in order to form a flexible multilayer metal-clad laminate.

11 Claims, No Drawings

REACTIVE-OLIGOIMIDE ADHESIVES, LAMINATES, AND METHODS OF MAKING THE LAMINATES

FIELD OF THE INVENTION

This invention relates to reactive oligoimides, which may serve as adhesives for bonding at least one layer or film to another layer, preferably a flexible metallic layer on a flexible layer of a polyimide, in order to form a flexible multilayer metal-clad laminate. The present invention also relates to the laminates themselves, as well as to methods for producing these laminates.

BACKGROUND OF THE INVENTION

Laminates comprising one or more layers of polyimide and one or more layers of metallic substrate material may be used for a variety of applications. For example, polyimide coated metal foils, due to the flexibility and outstanding mechanical, thermal and electrical properties of polyimides, can be used for printed electrical circuits. This is because the laminates are frequently exposed to high temperatures during further processing, for example, during soldering or drilling. The laminates also have to satisfy stringent requirements in regard to their electrical and mechanical properties.

Laminates comprising only one substrate layer of metal or metal alloy and a layer of polyimide, so called single clads, may be used for printed electrical circuits. The same applies to multilayer laminates, so called multi-clads or multilayer circuits, which comprise several metal layers and/or several polyimide layers.

Laminates containing polyimides and metal substrates are well-known in the art. Usually the polyimide layers are bonded to the metal substrate by a conventional adhesive. For example, U.S. Pat. No(s). 3,900,662, 3,822,175, and 3,728,150 disclose bonding of polyimide to metal using an acrylate-based adhesive. However, it has been found that when conventional adhesives such as acrylates, epoxides, polyamides, phenolic resins etc. are used to bond the polyimide to the metal, the resulting laminates do not exhibit entirely satisfactory properties which meet the stringent demands often imposed. Conventional adhesives do not generally possess the high temperature heat stability of the polyimide material itself, and the strength of the adhesive bonds in multilayer laminar polyimide structures deteriorates rapidly when subjected to elevated temperatures.

On account of the disadvantages of laminates comprising layers of conventional adhesives between polyimide and metal, multilayer laminates have been proposed in which the polyimide is bonded directly to metal, i.e., without a layer of adhesive. Thus, British Patent 2,101,526 discloses the bonding of a polyimide derived from biphenyltetracarboxylic dianhydride directly to metal foil by applying heat and pressure. The whole polyimide layer of this laminate, however, is subject to inferior thermal stability as compared to laminates made from layers of conventional polyimides. In addition, the selection of polyimides to be used in such laminates is limited.

Sheppard et al. U.S. Pat. No. 4,851,495 discloses polyetherimide oligomers having cross linking and end cap moieties, which provide improved solvent-resistance to cured composites. It also discloses blends generally comprising substantially equimolar amounts of the oligomers and a comparable, compatible, non-cross linking, etherimide polymer of substantially the same backbone. Sheppard utilizes all aromatic moieties with ether (—O—) or thioether (—S—) linkages as flexibilizing functions. To achieve any melt flow away from cure temperatures, m in his formula must be kept no more than 0 or 1. However, this makes the cured resin brittle and suitable only for rigid laminates and/or composites. Even for those applications, brittleness is probably the reason for resorting to blends with reactive plasticizers.

Scola U.S. Pat. No. 4,801,682 discloses high temperature polyimides, which are typically the copolymerization product of about 3 mole % to about 42 mole % nadic esters; about 39 mole % to about 49 mole % diamine; and about 17 mole % to about 48 mole % 4,4',9 (2,2,2-trifluoro-1-phenyletheridene)-biphthalic tetracarboxylic acid dialkylester. This chemistry deals with structural composites, where evolution of volatiles is not important. There is an abundance of volatiles because this chemistry involves partial esters of di- and tetracarboxylic acids with lower alcohols, which must be liberated during cure.

Tan et al U.S. Pat. No. 4,711,964 discloses bisbenzocyclobutene aromatic imide oligomers. This chemistry also involves structural composites, not suitable for adhesives. Benzocyclobutene end groups may be cured by Diels-Alder conditions requiring high temperatures, and lengthy times, as well as presence of dienenophiles such as commercial bismaleimides, generally leading to brittle resins.

D'Alelio et al U.S. Pat. No. 4,528,373 discloses unsaturated vinylacetylene-terminated polyimides and processes for their preparation. This invention involves high molecular weight polymers terminated in acetylenic functions requiring high post cure temperatures. The cure temperatures may be lowered by mixing in free radical initiators, which however, are inevitably incorporated in the resin with unknown impact on properties.

SUMMARY OF THE INVENTION

According to this invention, there are provided reactive oligoimides, which may serve as adhesives for bonding at least one layer or film to another layer or film, preferably a flexible metallic layer to a layer of a flexible polyimide, in order to form a flexible multilayer metal-clad laminate. More particularly, this invention pertains to a reactive oligoimide having the formula:

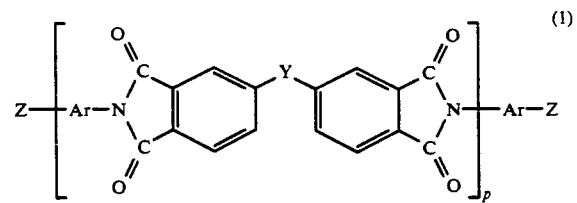

in which

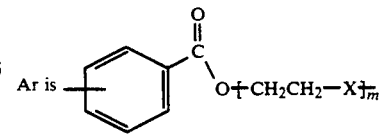

-continued

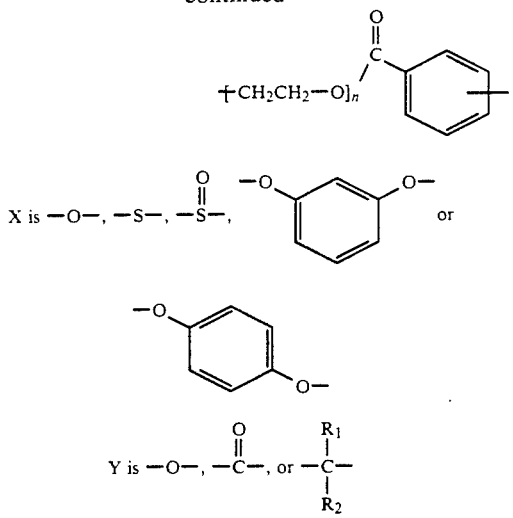

X is —O—, —S—, —S(=O)—, 1,3-phenylenedioxy or 1,4-phenylenedioxy

Y is —O—, —C(=O)—, or —C(R₁)(R₂)—

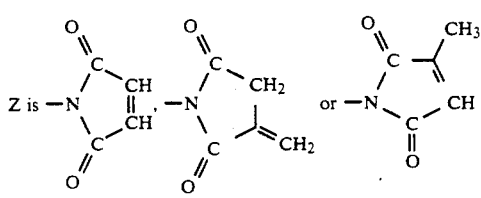

$R_1$ is —H, —CH$_3$, —C$_2$H$_5$ or —CF$_3$
$R_2$ is —H, —CH$_3$, —C$_2$H$_5$ or —CF$_3$
m is an integer of 0 or 1 n is an integer of 0 or 1 provided the sum of m and n is not 0 and
p is an integer of from 0 to 15.

Preferably, the reactive oligoimide
(a) has an ability to flow;
(b) it is soluble in at least one polar solvent selected from the group consisting of a sulfoxide, a formamide, an acetamide, N-alkyl-pyrrolidone, a ketone, and a mixture thereof.
(c) upon cross linking is insoluble in the polar solvent of (b), in which the reactive oligoimide is soluble.

The present invention also relates to a reacitve-oligoimide coated substrate, wherein the reactive oligoimide has the formula (1) as described immediately above.

In addition, the present invention also pertains a cross-linked oligoimide, as well as to laminate comprising a copper film, a polyimide film, and a cross-linked oligoimide adhesive between the copper film and the polyimide film, the cross-linked oligoimide having the formula:

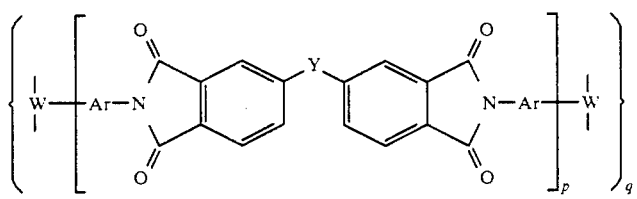

in which

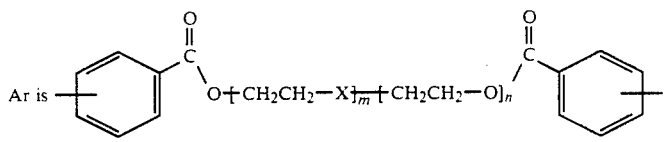

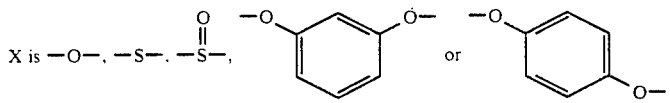

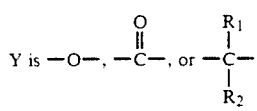

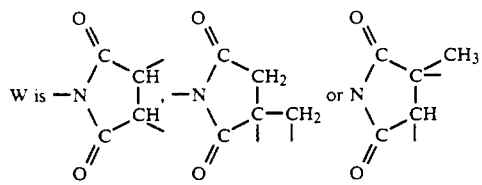

$R_1$ is —H, —CH$_3$, —C$_2$H$_5$ or —CF$_3$
$R_2$ is —H, —CH$_3$, —C$_2$H$_5$ or —CF$_3$
m is an integer of 0 or 1
n is an integer of 0 or 1 provided the sum of m and n cannot be 0 and
q is an integer greater than 10.

Finally the present invention relates to a method for making a laminate of a first film and a second film comprising the steps of:

(a) coating the first film with a solution of an oligomide in a polar solvent, the reactive oligoimide having a flow temperature, a curing temperature higher than the flow temperature, and a formula (1) as defined above;

(b) optionally heating the coated first film at a first temperature lower than the flow temperature of the reactive oligoimide, in order to remove most of the solvent from the reactive oligoimide coating;

(c) subjecting the coated first film to a second temperature, between the flow temperature and the curing temperature of the reactive oligoimide, in order to cause the reactive oligoimide to flow and substantially remove all the solvent from the reactive oligoimide coating;

(d) placing the second film against the reactive oligoimide coating, thus forming a sandwich; and (e) applying pressure to the sandwich at a third temperature between the flow temperature and the curing temperature of the reactive oligoimide in order to form an uncured laminate.

Preferably the above method further comprises an additional step of subjecting the uncured laminate of step (e) to the curing temperature, in order to form a cured laminate.

DETAILED DESCRIPTION OF THE INVENTION

The reactive oligoimides of the present invention may be utilized in general as adhesives for miscellaneous substrates. They are especially suited, however, as adhesives for polyimide layers or films to be bonded to metal layers or films, preferably copper, in order to form flexible polyimide metal-clad laminates having a peel strength of at least 3 pli (I.P.C. Standard Method 2.4.9, "Peel Strength, Flexible Printed Wiring Materials").

The reactive oligoimide of this invention, which may serve as adhesive, has a general formula:

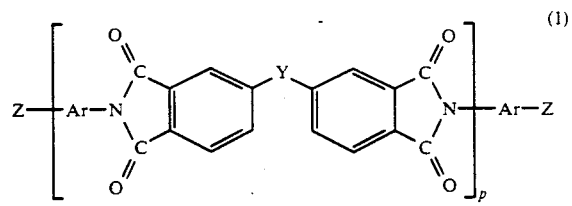

in which

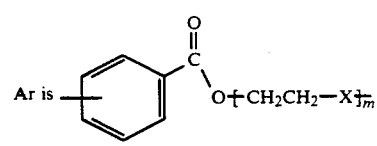

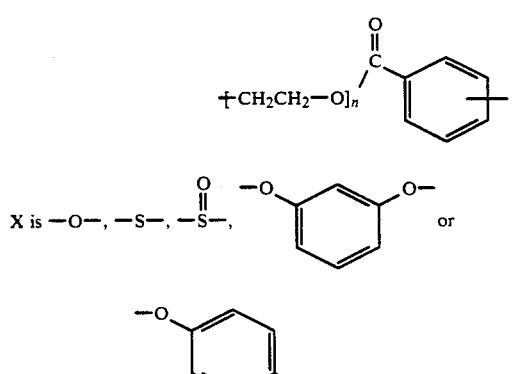

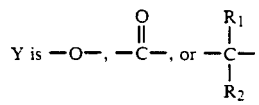

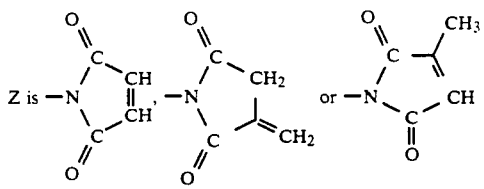

in which $R_1$ is —H, —$CH_3$, —$C_2H_5$ or —$CF_3$ $R_2$ is —H, —$CH_3$, —$C_2H_5$ or —$CF_3$ m is an integer of 0 or 1 n is an integer of 0 or 1 provided the sum of n and m is not 0 and p is an integer of from 0 to 15.

The different groups presented in the above formula should be preferably selected and combined in a manner that the oligoimide possesses three important properties, among others.

(a) it should have a flow temperature, at which it flows, as explained below;

(b) it should have a curing temperature, higher than the flow temperature, at which it cross links and becomes insoluble in polar solvents, (c) it should be soluble in a polar solvent at a temperature lower than the curing temperature.

It is also important, as aforementioned, that the reactive oligoimide flows at a temperature lower than the curing temperature, at least under pressure, thus behaving as a thermoplastic material. This flowability promotes wetting and better adhesion before the cure renders the oligoimide intractable. The temperature range at which the reactive oligoimide should flow is preferably between 100° C. and 220° C., and more preferably between 130° C. and 200° C. If the reactive oligoimide flows at a temperature considerably lower than 100° C., blistering may occur during lamination, while if it flows at temperatures in high excess of 200° C., curing may start taking place, hindering the flow. The pressure range is preferably between atmospheric pressure and 1,000 psi, and more preferably between atmospheric pressure and 300 psi.

The reactive oligoimide flows at a certain temperature and under certain pressure if a dry powder of the oligoimide placed between two polyimide films turns into a clear melt after it is pressed in a conventional heatable press, at said temperature and pressure for half an hour. Under flow conditions, the oligoimide may also be applied as an extruded coating.

It is important that the reactive oligoimide has a curing temperature, at which it cross links, and thus it becomes insoluble in polar solvents. Insolubility of the cross linked oligoimides in polar solvents promotes better durability and insensitivity to weather and other adverse conditions. In addition, the increase in molecular weight, due to cross linking, strengthens the structural configuration of the adhesive, and thus it increases the cohesive strength, by removing brittleness and providing better flexibility.

The cross linked oligoimide meets the condition of being insoluble in polar solvents if it is insoluble in solvents selected from the group consisting of sulfoxides, formamides, acetamides, N-alkyl-pyrrolidones, ketones, and mixtures thereof, at least at temperatures lower than the curing temperature.

It is preferable that the curing temperature is higher than 200° C. and lower than 350° C., and more preferable higher than 230° C. and lower than 300° C. If the curing temperature is lower than 200° C., premature curing may interfere with a lamination process in which the reactive oligoimide of the present invention may be used, as it is discussed at a later section, while if the curing temperature is considerably higher than 350° C., appreciable thermal/oxidative degradation may take place, which in turn may have detrimental consequences on the performance of the cured oligoimide. In addition, if copper is present it will oxidize excessively, unless curing is taking place in inert atmosphere, which is very expensive and therefore, undesirable; blistering may also occur. Further, it is always preferable to be able to cure at as low a temperature as possible for energy conservation. At these temperatures, the oligoimide of this invention behaves as a thermoset material.

Preferably, the difference between the curing temperature of an oligoimide of this invention and the flow temperature should be greater than 10° C., more preferably greater than 20° C., and even more preferably greater than 40° C. Under these conditions, the reactive oligoimide of this invention behaves initially as a thermoplastic material, while it behaves as a thermoset material at more elevated temperatures.

A way to determine with good accuracy the melting point as well as the curing temperature of the reactive oligoimides of this invention is by Differential Scanning Calorimetry (DSC). The melting point as determined by this technique may also be an approximation of the flow temperature determined as described earlier.

It is further important that the reactive oligoimide is substantially soluble in at least one polar solvent, including any suitable mixture of solvents, when heated at a temperature between the flow temperature and the curing temperature for ¼ hour, and then brought to room temperature. This is because it is highly preferable to apply adhesive layers of the reactive oligoimides of this invention from solution rather than in the form of powders and the like. By being soluble it is meant that a major portion representing more than 95% by weight of the reactive oligoimide under consideration comes to clear solution.

The solution should be flowable and suitable for application preferably at room temperature, when the content in dissolved reactive oligoimide is preferably higher than 5%, more preferably higher than 10%, and even more preferably higher than 20% by weight.

Preferably the reactive oligoimide dissolved as discussed above, remains in solution for extended periods of time. Thus it is preferable that the reactive oligoimide remains in solution for more than 24 hours, more preferably more than 15 days, and even more preferably more than one month, when maintained at room temperature. If the reactive oligoimide solution is kept in the refrigerator, these periods are extended considerably. However, it is commercially undesirable and expensive to store and handle materials at temperatures lower than room temperature.

It is preferable that the polar solvent in which the reactive oligoimide is soluble is selected from the group consisting of sulfoxides, formamides, acetamides, N-alkyl-pyrrolidones, ketones, and mixtures thereof. From these groups of solvents, N-methyl-2-pyrrolidone is preferable.

Although the nitrogen atom of the Z group in Formula (1) may be connected in any position of the terminal benzene rings of the Ar group, the meta-position is preferable as contributing higher flexibility when compared to the para-position. The ortho-position would give very unstable structures, if any, due to steric hindrance.

The molecular weight of the reactive oligoimide is of high importance, since comparatively high molecular weights decrease drastically the usable concentration of reactive oligoimide in a solvent, or raise excessively the viscosity, and they also decrease the cross link density resulting in inferior properties of the finally cross linked oligoimide adhesive. Thus, it has been found that p, which is a measure of molecular weight, should be kept preferably between 0 and 15, more preferably between 3 and 10, and even more preferably between 4 and 8.

The values of m and n in Formula (1) should be 1 or 0, with the requirement that both cannot be 0 at the same time. Considerably higher values would detract from thermal/oxidative stability, while a value of 0 for both would increase the flow temperature excessively. The ether-functionality providing entity —X— may take a number of different forms, as shown in Formula (1), with preference to —O—$C_6H_4$—O—..

—Y— may also take a number of different forms, with —$C(CF_3)_2$—, at least partially, being the preferred form, since it provides a number of advantages, including considerable extension of solution shelf-life, and lower dielectric constant. For economic reasons, however, one might prefer to use structures where —Y— is mainly —CO—, with an adequate amount of structures where —Y— is —$C(CF_3)_2$— (preferably at least 10 mole % and more preferably at least 25 mole %), so that the shelf-life of the final product solution is extended to a desired level.

—Z— may be provided in the form of maleimide, itaconimide, citraconimide, or mixtures thereof, the preferable being maleimide. The double bonds of these groups open and react with each other to cross link the reactive oligoimide at a range of temperatures between 230° C. and 300° C.

Diamines may also be used to extend the reactive oligoimides of the present invention by Michael addition, the preferable diamines for this purpose being ones having the general formula $H_2N$—Ar— $NH_2$, where —Ar— has the structure as defined above. Although the cross link density due to double bonds decreases by the extension with the diamine, further reaction of the formed secondary amine with remaining double bonds provides additional cross linking at curing temperatures. Adhesives of good properties may be obtained even in the case where p=0, and an oligoimide of the formula Z—Ar—Z is extended with a diamine having the formula $H_2N$—Ar—$NH_2$ or $H_2N$—Ar'—$NH_2$, wherein Ar and Ar' have the same definition as given above, but they are not necessarily identical in the oligoimide and in the extending diamine structures. More rigid diamines require higher values for p. The most preferred diamine, however, is hydroquinone-bis[2-(3-aminobenzoyloxy)ethyl]ether.

The reactive oligoimides of this invention may be prepared by conventional polyimide chemistry techniques, well known in the art.

A diamine having the formula $H_2N$—Ar—$NH_2$, which may be prepared as indicated in Examples 1 and 2, or which may be commercially available, is reacted with a dianhydride having the formula $O(CO)_2-C_6H_3-Y-C_6H_3-(CO)_2O$, in the desired molecular proportions, wherein —Ar— and in the desired molecular proportions, where in —Ar— and —Y— have the same definitions as in Formula (1), yielding an oligomeric amic acid. In sequence, maleic, or itaconic, or citraconic anhydride, or a mixture thereof is added, followed by addition of an excess of a water scavenger, such as for example acetic anhydride, in order to form an oligoimide of the present invention in crude form. A catalyst, such as a tertiary amine may also be used. The reactive oligoimide is then precipitated, rinsed, and dried to obtain its purified form.

Application of the reactive oligoimide solution can be accomplished in any number of ways, such as by slit die, dipping or kiss-roll coating, followed by metering with doctor knife, doctor rolls, squeeze rolls or air knife. It may also be applied by brushing or spraying.

Using such techniques, it is possible to prepare both one- and two-side coated structures. In preparation of the two-side coated structures, one can apply the coatings to the two sides either simultaneously or consecutively before going to the drying and curing stage.

The reactive oligoimide adhesive may be coated on a polyimide base film or on a metal substrate. The polyimide base film may be used as is, or it may be prepared by either a chemical or thermal conversion process and may be surface treated, e.g., by chemical etching, corona treatment, laser etching etc., to improve adhesion.

A single polyimide metal-clad of the present invention comprises a reactive oligoimide layer which adheres to a metal foil such as a copper, aluminum, nickel, steel or an alloy containing one or more of these metals as a substantial constituent, or to a foil of amorphous metal. The reactive oligoimide layer adheres firmly to the metal and has a peel strength of 3 pli or higher. The metals do not have to be used as elements in pure form, i.e., it is also possible to use substrates of metal alloys, such as alloys containing nickel, chromium or iron or nickel and copper, or of amorphous alloys containing iron. Particularly suitable metallic substrates are foils of rolled, annealed copper alloy, In many cases, it has been proven to be of advantage to pretreat the metallic substrate before coating. The pretreatment, if used, may consist of chemical treatment or a mechanical roughening treatment. This pretreatment enables the adhesion of the reactive oligoimide layer and, hence, the peel strength to be further increased. Apart from roughening the surface, the chemical pretreatment may also lead to the formation of metal oxide groups, which may enable the adhesion of the metal to the copolyimide later to be further increased.

A polyimide multi-clad of the present invention compromising a double side copper clad may be prepared by laminating copper foil to both sides of an adhesive coated dielectric polyimide film. The construction can also be made by laminating adhesive coated copper foil to both sides of a dielectric polyimide film or to an adhesive coated dielectric polyimide film.

Roll clads may also be made by continuous lamination of the adhesive coated dielectric film to copper foil using a high temperature double belt press or a high temperature nip roll laminator.

In general, the preferred method for making a laminate of a first film and a second film comprises a number of steps.

The initial step is to coat the first film with a solution of a reactive oligoimide in a polar solvent, according to this invention. The coated film is then optionally heated to a first temperature lower than the flow temperature of the reactive oligoimide, in order to remove most of the solvent from the reactive oligoimide coating, and then it is subjected a second temperature, between the flow temperature and the curing temperature, in order to cause the reactive oligoimide to flow and substantially remove all the solvent from the reactive oligoimide coating. The second film is then placed against the reactive oligoimide coating, thus forming a sandwich, and pressure is applied to the sandwich at a third temperature, again between the flow temperature and the curing temperature of the reactive oligoimide, in order to form an uncured laminate. The second and the third temperatures may be the same or different. The uncured laminate may then be cured and form a cured laminate, by subjecting it to the curing temperature, in the press or out of the press. Preferably one of the first and the second films is copper and the other is polyimide.

The polyimide base films used in the laminates of the invention are preferably about 0.3 to 5 mils in thickness and can be obtained from polyamic acid precursors derived from the reaction of suitable diamines with suitable dianhydrides in the manner described in, for example, U.S. Pat. No. 3,179,614.

Examples of dianhydrides which may be used in the polyimide base film include:
pyromellitic dianhydride;
3,4,9,10-perylene tetracarboxylic dianhydride;
naphthalene-2,3,6,7-tetracarboxylic dianhydride;
naphthalene-1,4,5,8-tetracarboxylic dianhydride;
bis(3,4-dicarboxyphenyl) ether dianhydride;
bis(3,4-dicarboxyphenyl) sulfone dianhydride;
2,3,2',3'-benzophenonetetracarboxylic dianhydride;
bis(3,4-dicarboxyphenyl) sulfide dianhydride;
bis(3,4-dicarboxyphenyl) methane dianhydride;
2,2-bis(3,4-dicarboxyphenyl) propane dianhydride;
2,2-bis(3,4-dicarboxyphenyl) hexafluoropropane;
3,4,3',4'-biphenyltetracarboxylic dianhydride;
2,6-dichloronaphthalene-1,4,5,8-tetracarboxylic dianhydride;
2,7-dichloronaphthalene-1,4,5,8-tetracarboxylic dianhydride;
2,3,6,7-tetrachloronaphthalene-1,4,5,8-tetracarboxylic dianhydride; phenanthrene-1,8,9,10-tetracarboxylic dianhydride; pyrazine-2,3,5,6-tetracarboxylic dianhydride; benzene-1,2,3,4-tetracarboxylic dianhydride; and thiophene-2,3,4,5-tetracarboxylic dianhydride.

Examples of diamines which may be used together with the dianhydrides in the polyimide base film include the following:
meta-phenylenediamine;
para-phenylenediamine;
2,2-bis(4-aminophenyl) propane;
4,4'-diaminodiphenylmethane;
4,4'-diaminodiphenyl sulfide;
4,4'-diaminodiphenyl sulfone;
3,3'-diaminodiphenyl sulfone;
4,4'-diaminodiphenyl ether;
2,6-diaminopyridine;
bis(3-aminophenyl) diethyl silane;
benzidine;
3,3'-dichlorobenzidine;
3,3'-dimethoxybenzidine;
4,4'-diaminobenzophenone;
N,N-bis(4-aminophenyl)-n-butylamine;

N,N-bis(4-aminophenyl) methylamine;
1,5-diaminonaphthalene;
3,3'-dimethyl-4,4'-diaminobiphenyl;
m-aminobenzoyl-p-aminoanilide;
4-aminophenyl-3-aminobenzoate;
N,N-bis(4-aminophenyl) aniline;
2,4-bis(beta-amino-t-butyl) toluene;
bis(p-beta-amino-t-butylphenyl) ether;
p-bis-2-(2-methyl-4-aminopentyl) benzene;
p-bis(1,1-dimethyl-5-aminopentyl) benzene;
m-xylylenediamine;
p-xylylenediamine;
position isomers of the above, and mixtures thereof.

The preparation of polyimides and polyamic acids is more fully described in U.S. Pat. No(s). 3,179,614 and 3,179,634.

A particularly preferred polyimide base film is derived from 4,4'-diaminodiphenyl ether and pyromellitic dianhydride.

| BMI | Bismaleimide |
|---|---|
| BTDA | Benzophenone tetracarboxylic acid dianhydride |
| DMAC | Dimethylformamide |
| 6FDA | 2,2'-bis(3,4-dicarboxyphenyl)-hexafluoropropane |
| HQ-BABEE | Hydroquinone-bis[2-(3-aminobenzoyl-oxy)-ethyl]ether |
| HQ-BNBEE | Hydroquinone-bis[2(nitrobenzoyloxy)-ethyl]ether |
| NMP | N-methyl 2-pyrrolidone |

In the following examples all percentages are by weight unless otherwise indicated.

EXAMPLE 1

Preparation of hydroquinone-bis[2(nitrobenzoyloxy)-ethyl]ether

In a 5-liter flask, fitted with mechanical stirrer, thermometer, nitrogen inlet, and condenser topped with a calcium sulfate drying tube, there were dissolved 426 g (2.15 miles) of hydroquinone-bis(2-hyroxyethyl)ether (from Aldrich Chemical) in 1800 ml DMAC and 750 ml pyridine.

To the stirred solution there were added in small portions 800 g (4.3 moles) of 3-nitrobenzoyl chloride (from Aldrich Chemical) at a rate that the reaction temperature did not exceed 80° C. The mixture was stirred at 70°-75° C. for 3 hours during which solids began to separate. The mixture was cooled to room temperature and poured into stirred methanol, maintained cold by addition of ice cubes. The precipitated dinitro-diester compound was collected by suction filtration and rinsed with copious amounts of water to remove solvents and salts. After a rinse with cold methanol the product was air dried as much as possible while still in the funnel, then vacuum dried overnight at 110° C. The yield of HQ-BNBEE, m.p. 169°-171° C., was 1020 g (96%).

Equally good product in excellent yields is obtained by conventional esterification of the ethoxylated hydroquinone used above with 3-nitrobenzoic acid in xylene solvent in presence of methanesulfonic acid catalyst. The reaction is completed when the theoretical amount of water has been collected using a Dean Stark trap.

EXAMPLE 2

Preparation of HQ-BABEE by reduction of its nitro-precursor

The dinitrocompound (hydroquinone-bis[2(nitrobenzoyloxy)-ethyl]ether) described in Example 1 was hydrogenated to the corresponding diamine by initially charging 180 g of the compound in a 1000 ml shaker tube along with 600 ml of DMAC, and 5 g catalyst (10% Pd on carbon), followed by charging hydrogen at 500 psig until there was no further pressure drop. The reduction mixture was heated to dissolve separated solids, filtered to remove carbon and catalyst, then poured into a stirred, ice-cold methanol/water mixture causing precipitation of a slightly yellow diamine. The latter was collected by action filtration, rinsed with water and cold methanol; then vacuum dried overnight at 110° C. The yield of HQ-BABEE, melting at 139°-141° C., was practically theoretical. Elemental Analysis:

Calculated for $C_{24}H_{24}O_6N_2$: C, 66.04; H, 5.56; O, 22.00; N, 6.42. Found: C, 65.92; H, 5.53; O, 22.27; N, 6.28.

EXAMPLE 3

6FDA(4)//HQ-BABEE(5)-BMI

In a predried (flame) one-liter, 4-neck flask fitted with thermometer, mechanical stirrer, inlet for dry nitrogen and outlet connected to a bubbler (to monitor nitrogen flow), were placed 43.6 g (0.1 mole) HQ-BABEE and 300 ml NMP that had been dried over molecular sieves. The mixture was stirred at ambient temperatures until all the diamine had dissolved while maintaining a gentle nitrogen flow. To the stirred solution was added in one portion 35.5 g (0.08 mole) 6FDA causing the internal temperature to rise to about 40° C. and solution viscosity to increase. The mixture was stirred at room temperature for 3.5 hours, at the end of which time 5.7 g (0.055 mole) maleic anhydride was added. Stirring was continued for 3 hours to allow for reaction of maleic anhydride with the amine end groups of the condensation oligomeric amic acid. To the stirred mixture were then added in quick succession 40 ml acetic anhydride, 10 ml triethylamine and 2 g anhydrous sodium acetate and stirring was continued for 4 hours. The solution was poured into stirred deionized water and the precipitated yellow reactive oligoimide was collected by suction filtration. After several rinses with deionized water and one rinse with methanol the soft flake was dried overnight under vacuum at 110° C.

The above reactive oligoimide flows in the range of 140°-200° C., and it dissolves in NMP to make solutions containing more than 40% reactive oligoimide by weight. These solutions have very long shelf life (>2 months):

EXAMPLE 4

6FDA(9)//HQ-BABEE(10)-BMI

The experimental set up and the overall procedure were the same as in Example 3, with the difference of reagent amounts as shown below:

HQ-BABEE: 43.6 g (0.1 mole)
6FDA: 40 g (0.9 mole)
NMP: 334 ml
Maleic anhydride: 3 g (0.03 mole)
Acetic anhydride: 40 ml Triethylamine: 10 ml Anhydrous sodium acetate: 2 g.

This higher molecular weight reactive oligoimide still flowed at 170°–200° C., dissolved in NMP (>35%), and solutions were very stable.

EXAMPLE 5

6FDA(1)//HQ-BABEE(1)

In the same reaction set up as in Example 3, there were placed 43.6 g (0.1 mole) HQ-BABEE and 350 ml NMP. The mixture was stirred at room temperature until all the diamine had dissolved. To the stirred solution, there was added 44.4 g (0.1 mole) 6FDA in two steps. First, about 43 g of 6FDA were added in one portion with stirring, which caused the temperature to rise to about 40° C. Within a few minutes, the solution viscosity increased significantly. After about 2 hours the remaining 6FDA (1.4 g) was dissolved in 10 ml dry NMP and added into the stirred mixture in small increments every 10–15 minutes, each addition resulting in further increase of viscosity. About 30 minutes after addition of the last aliquot, there was no detectable vortex around the stirring shaft. The polymer was isolated by pouring in stirred deionized water, followed by suction filtering. After several rinses with water and one rinse with methanol, the tough flake was dried overnight at 110–120° C.

Inherent viscosity was 0.79 (DMAC/LiCl), corresponding to a molecular weight of 80–100,000. The flake flowed at 200° C., proving that HQ-BABEE imparts thermoplasticity at very high molecular weight levels.

EXAMPLE 6

BTDA(4)//HQ-BABEE(5)-BMI

The reaction set up and procedure were the same as in Example 3.

In the flask, there were placed 43.6 g (0.1 mole) HQ-OBABEE and 280 ml NMP. To the stirred solution, there were added 25.8 g (0.08 mole) BTDA in one portion, and stirred for 3.5 hours. In sequence, 5.7 grams of maleic anhydride were added, and the mixture was stirred for 3 hours as in Example 3. All other reagents (for imidization) were the same and in the same amounts as in Example 3. Precipitation and purification again was the same as in Example 3.

NOTE: 35% solutions in NMP could be used the same date and give excellent lamination/adhesion results. However, reactive oligoimide crystallizes out after storage at room temperature for about 24 hours. More dilute solutions (25% have somewhat longer shelf life, up to 3 days). Shelf life can be extended further by storing at low temperatures, which is still rather inconvenient.

The flake produced this way flows in the 160°–200° C. range as above.

EXAMPLE 7

BTDA(3)/6FDA(1)//HQ-BABEE(5)-BMI

This example demonstrates that the shelf life of an oligoimide such as the one described in example 6, may increase considerably by replacing part of the BTDA with 6FDA. Set up, procedure and reagents were the same as in example 6, except as indicated below.

43.6 g (0.1 mole) of HQ-BABEE were dissolved in 300 ml NMP. To this, there were added 19.3 g (0.06 mole) BTDA and 8.9 g (0.02 mole 6FDA). Everything else was the same as in example 6.

The flake produced in this manner flows in the same range of 160°–200° C., but solution shelf life appears to be as good as that of the reactive oligoimides made by using exclusively 6FDA.

EXAMPLE 8

Lamination and Adhesion Results

A 35% solution of BTDA(4)/HQ-BABEE(5)-BMI in NMP was used to coat brass-treated copper (commercially designated as ED copper) using a doctor's knife at 5 mil wet clearance. The coated sheets were placed in a convection oven at 160° C. for about one hour to remove NMP. Copper plus adhesive was then laminated onto LF020 Kapton ® film (2 mil thick polyimide film, available from E. I. du Pont de Nemours and Company, Wilmington, Delaware) at 170° C. and 200 psi for 30 minutes, followed by cooling to 75° C., while maintaining 200 psi pressure. The laminates were then cured by placing them in the same oven for 30 minutes at 240° C., and then for one hour at 280° C. There were no visible blisters or bubbles.

Peel strength was determined by using 0.5" strips, and pulling the copper and Kapton films apart (I.P.C. Standard Method 2.4.9, "Peel Strength, Flexible Printed Wiring Materials"). In all instances the Kapton ® film broke at about 9.5 pli (Pounds per Linear Inch), which means that the peel strength was better than 9 pli.

EXAMPLE 9

A. Preparation of (HQ-BABEE-BMI)

In a one-liter flask fitted with mechanical stirrer, thermometer and inlet/outlets for nitrogen, there were placed 43.6 g (0.1 mole) of the above diamine and 200 ml N-methyl pyrrolidone (NMP). The mixture was stirred at ambient temperature until all the diamine had dissolved and 24.5 g (0.25 mole) maleic anhydride was added causing temperature to rise to about 40°–45° C. The mixture was stirred (cooling on its own) for 1.5 hours at ambient temperatures. At the end of that time, 45 ml of acetic anhydride and 2.5 g anhydrous sodium acetate were added, and the mixture was stirred at ambient temperature for 3 hours to effect imidization. The mixture was poured in water under stirring, and the precipitated bismaleimide was collected by suction filtration. After several rinses with water the product was dried on the funnel as much as possible with continued suction, and then overnight at 90° C. under vacuum. The cream-colored powder melted at 135°–137° C.

B. "Michael Addition" of HQ-BABEE-BMI with HQ-BABEE

Three different mixtures of the above BMI with HQ-BABEE diamine were prepared as follows:

(1) 6.0 g HQ-BABEE-BMI, 4.4 g HQ-BABEE (1:1 molar ratio) and 10.4 g NMP, i.e., 50% solids.

(2) 6.0 g HQ-BABEE-BMI, 3.2 g HQ-BABEE (4/3 molar ratio) and 9.2 g NMP, i.e., 50% solids.

(3) 6. g HQ-BABEE-BMI, 2.2 g HQ-BABEE (2/1 molar ratio) and 8.2 g NMP, i.e., 50% solids.

These mixtures were heated to about 60° C., and then to 120° C. for about one hour, resulting in homogeneous solutions, followed by cooling to ambient temperatures.

C. Lamination

The above solutions were used to laminate a copper film to a polyimide film, in the same manner as described in example 8. Evaluation of peel strength gave the following results:

(1) 3 pli;
(2) 4.7 pli; and
(3) 3.8 pli

What is claimed is:

1. A reactive oligoimide having the formula:

(1)

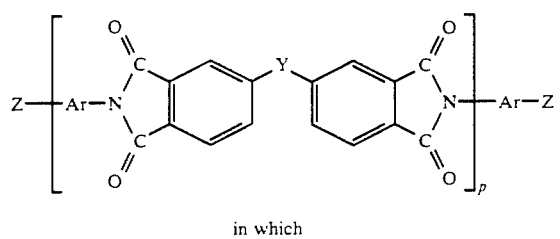

in which

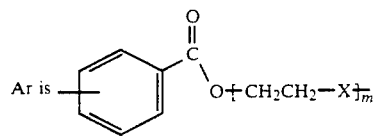

Ar is

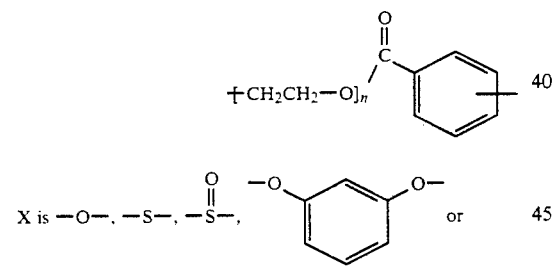

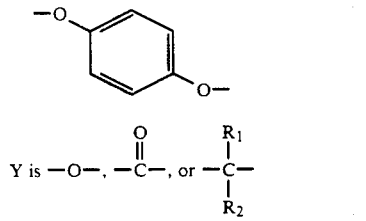

X is $-O-$, $-S-$, $-\overset{O}{\underset{O}{S}}-$,

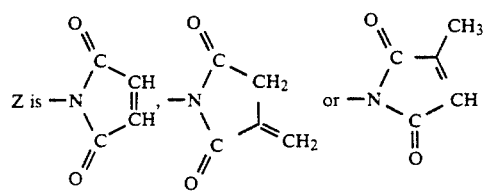

Y is $-O-$, $-\overset{O}{C}-$, or $-\overset{R_1}{\underset{R_2}{C}}-$

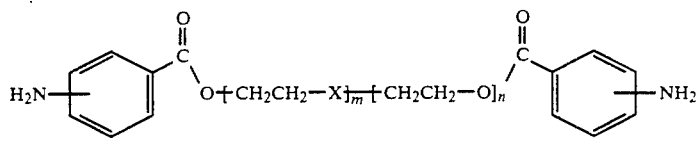

$R_1$ is $-H$, $-CH_3$, $-C_2H_5$ or $-CF_3$
$R_2$ is $-H$, $-CH_3$, $-C_2H_5$ or $-CF_3$
m is an integer of 0 or 1
n is an integer of 0 or 1 provided the sum of m and n is not 0 and
p is an integer of from 0 to 15.

2. A reactive oligoimide as defined in claim 1, wherein the reactive oligoimide
   (a) has an ability to flow;
   (b) is soluble in at least one polar solvent selected from the group consisting of a sulfoxide, a formamide, an acetamide, N-alkyl-pyrrolidone, a ketone, and a mixture thereof.
   (c) upon crosslinking is insoluble in the polar solvent of (b), in which the reactive oligoimide is soluble.

3. A reactive oligoimide as defined in claim 1, wherein the oligoimide is extended with a diamine having the formula:

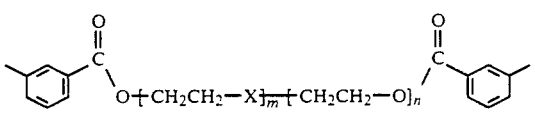

4. A reactive oligoimide as defined in claim 1, wherein $-Ar-$ is of the formula:

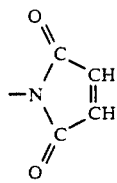

5. A reactive oligoimide as defined in claim 1, wherein p is 4 or 5.
6. A reactive oligoimide as defined in claim 1, wherein m and n are both 1.
7. A reactive oligoimide as defined in claim 1, wherein X is $-O-C_6H_4-O-$.
8. A reactive oligoimide as defined in claim 1, wherein Z is of the formula:

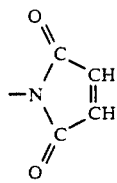

9. A reactive oligoimide as defined in claim 1, wherein at least 10 mole % of Y is of the formula:

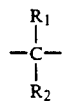

in which both $R^1$ and $R^2$ are $-CF_3$.

10. A reactive oligoimide as defined in claim 9, wherein at least 25 mole % of Y is of the formula

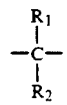

in which both $R^1$ and $R^2$ are $-CF_3$, and wherein the remainder of Y is of the formula $-CO-$.

11. A crosslinked oligoimide having the formula:

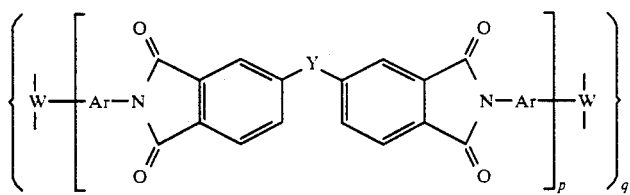
in which
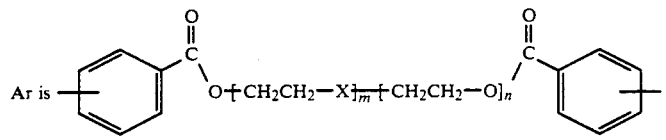
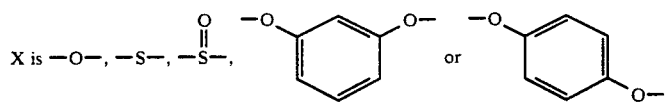
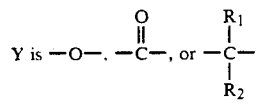
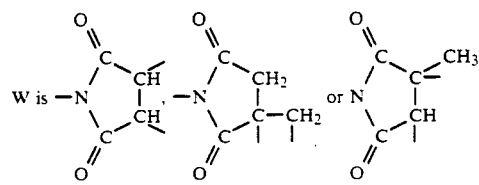
$R_1$ is —H, —CH$_3$, —C$_2$H$_5$ or —CF$_3$
$R_2$ is —H, —CH$_3$, —C$_2$H$_5$ or —CF$_3$
m is an integer of 0 or 1
n is an integer of 0 or 1 provided the sum of m and n cannot be 0
P is an integer of from 0 to 15 and
p is an integer greater than 10.